INVENTOR.
STEPHEN A. TONOZZI
BY Williamson, Palmatier & Bains
ATTORNEYS

METHOD OF MANUFACTURING PRINTED CIRCUIT BOARDS

Filed April 11, 1966 Sheet 2 of 2

INVENTOR.
STEPHEN A. TONOZZI
BY Williamson, Palmatier & Bains
ATTORNEYS

United States Patent Office 3,447,960

Patented June 3, 1969

3,447,960

METHOD OF MANUFACTURING PRINTED CIRCUIT BOARDS

Stephen A. Tonozzi, 5140 45th Ave. S., Minneapolis, Minn. 55417

Filed Apr. 11, 1966, Ser. No. 541,579
Int. Cl. H05k 3/06
U.S. Cl. 117—212 7 Claims

ABSTRACT OF THE DISCLOSURE

A method of manufacturing printed circuit boards wherein a first conductive layer laminated to an insulating substrate is coated with an etch resistant material applied in a desired circuit line pattern, a second conductive and etchable layer is plated over the first conductive layer and the etch resistant coating, and a second etch resistant coating is then applied to define a connector pad pattern in the portions of the second conductive layer lying thereunder. The portions of the first and second conductive layers not protected by the etch resistant coatings are then simultaneously removed in a single etching operation, thus leaving only the circuit line pattern in the first conductive layer and the connector pads in contact therewith. A second insulating layer is applied over the circuit lines and around the connector pads, leaving the top ends of the connector pads exposed for contact with a second circuit line pattern which may be formed on the second insulating layer by repeating the foregoing steps.

This invention relates to a method of manufacturing printed circuit boards and more particularly relates to a method for manufacturing multi-layer printed circuit boards.

A multi-layer printed circuit board is generally fabricated from a substrate with circuit lines adhered thereto, connector pads joining predetermined circuit lines between predetermined layers of multi-layer board, an insulating layer between each layer of circuit lines and connector holes through the pads adapted to join predetermined circuit lines of predetermined layers. In the manufacture of these printed circuit boards, reliability is of utmost importance. Problems in circuit board manufacture come from improper etching of the circuit line pattern or connector pad pattern, improper joining of the connector pad to the circuit line or improper registry of the dot pattern between layers in a multi-layer board. Improper etching destroys the connection between the connector pad and circuit line thereby "breaking the circuit" and oftentimes resulting in complete failure of the device in which the circuit board is used. It is obvious that the etching steps be kept at a minimum if a reliable board is to be provided. These problems become of a greater magnitude as the number of layers in a circuit board is increased.

Multi-layer circuit boards are becoming extremely important in the quest for compact, reliable wiring. The multi-layer board finds particular use in the interconnection of functional modules into large subsystem. A module is any type of functional block, for example, a single sided circuit board which must be connected into the multi-layer board, joining it with other functional blocks to form an integrated circuit.

The compact multi-layer board has found a high degree of acceptance in military use. However, military standards are extremely high and the reliability of the multi-layer board must be correspondingly high in order to achieve acceptance. This reliability requirement dictates an exact manufacturing procedure. A typical multi-layer printed circuit board will have about 500 holes drilled therein to connect the various connector pads joining the predetermined circuits from predetermined layers of the multi-layer board. Consequently, each circuit in each layer must have a high reliability and the connector pads which join predetermined layers through a common hole and connect within the hole must be in perfect registry to avoid connecting other than the predetermined layers.

With these comments in mind, it is to the elimination of these and other disadvantages to which the present invention is directed along with the inclusion therein of certain other novel and desirable features.

An object of my invention is the provision of a new and improved method of simple and inexpensive operation and steps for the manufacture of reliable printed circuit boards.

Another object of my invention is the provision of a method which provides circuit boards having highly reliable circuit lines and highly reliable connection between the connector pads and the circuit lines.

Still another object of my invention is the provision of a multi-layer circuit board which provides proper registry between the layers of the multi-layer board whereby the connector pads in the various layers are in registry permitting proper joinder of the predetermined layers of circuits.

A further object of my invention is to provide a method utilizing a minimum number of etching steps.

A still further object of my invention is the provision of a method which will permit operation by a person of minimum skill and manual dexterity.

These and other objects and advantages of my invention will more fully appear from the following description made in connection with the accompanying drawings wherein like reference characters refer to the same or similar parts throughout the several views, and in which.

Figure 1:
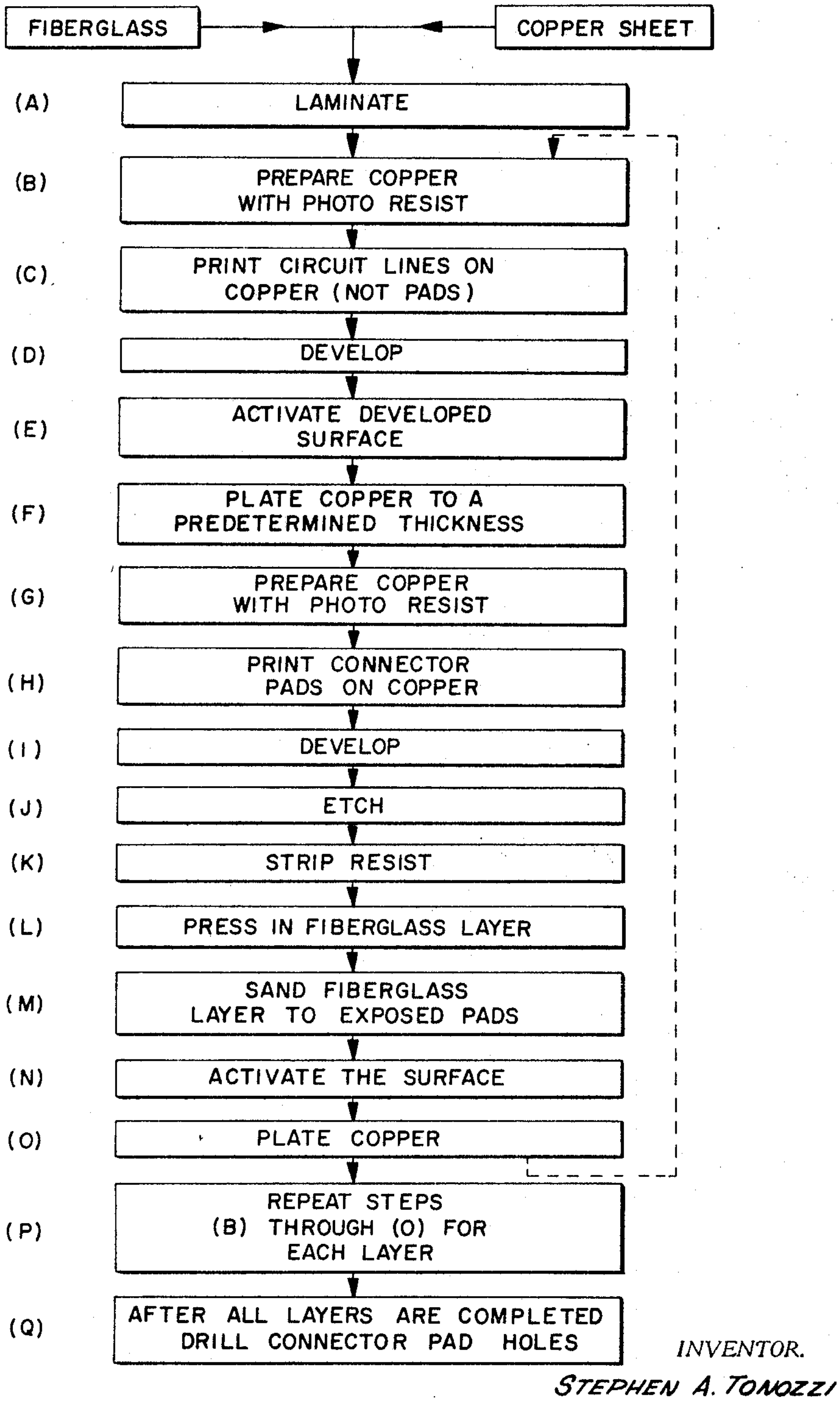
FIG. 1 is a flow diagram of the steps of my method with each significant stage of development denoted in alphabetical order.

One form of the present invention is shown in the drawings and is described herein. It should be noted that the circuit lines and connector pads shown in the drawings are simplified for purposes of the explanation and do not necessarily show a circuit of any significance. Further, the circuit described is a copper circuit adhered to a rigid fiberglass substrate. It should be understood, of course, that other metallic conductors may be adhered to other insulators, whether rigid or flexible, without departing from the scope of my method. The various layers shown in the figures are exaggerated for clarity.

Figures 2, 3, 4, 5, 6, 7, 8, 9, 10, 11, 12:
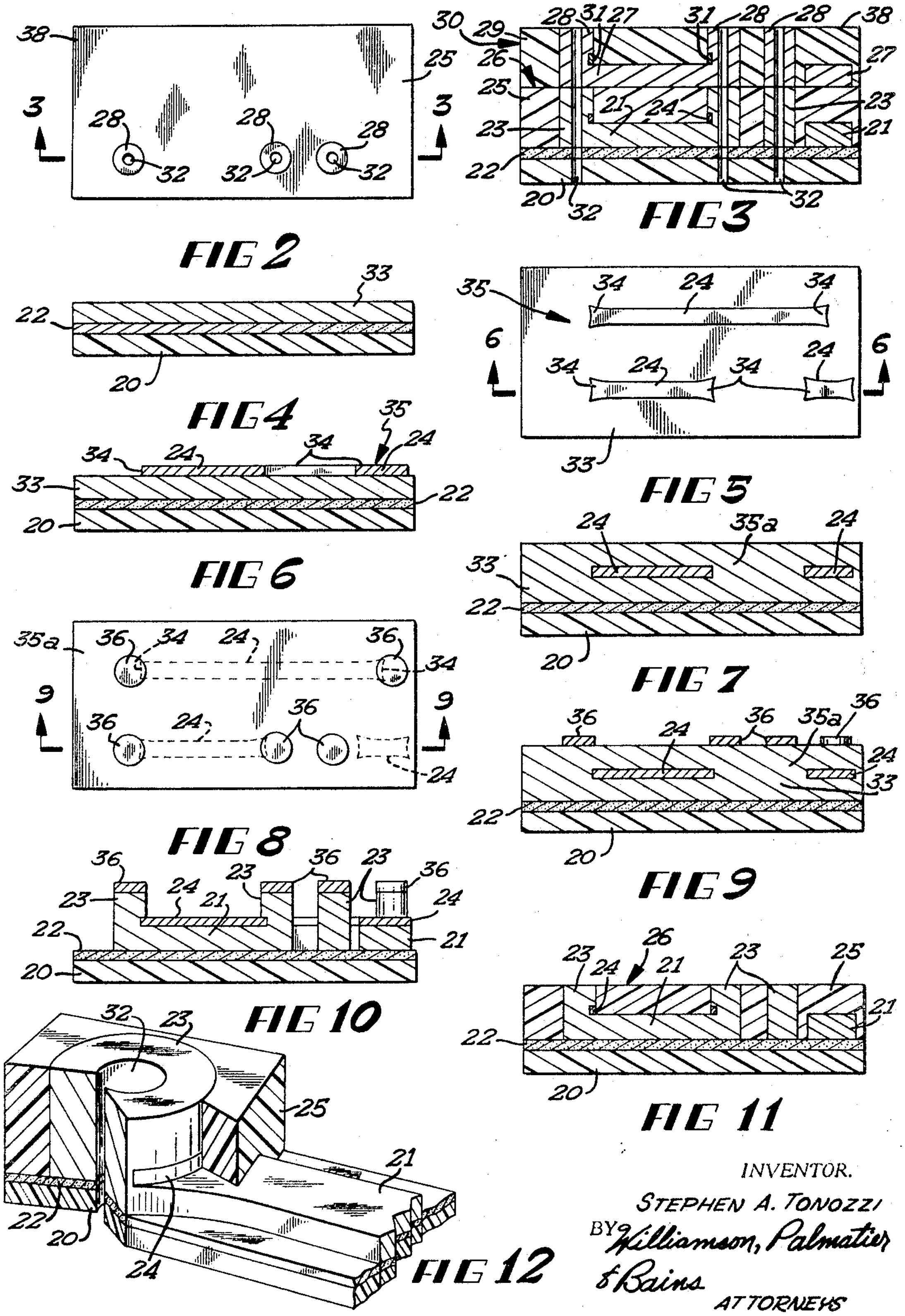
FIG. 2 is a plan view of a complete printed circuit board having two circuit layers and made by my method.
FIG. 3 is a sectional view taken along the line 3—3 of FIG. 2.
FIG. 4 is a vertical sectional view of a printed circuit board corresponding to the stage of development shown at step (B) of FIG. 1.
FIG. 5 is a plan view corresponding to the stage of development shown at step (D) of FIG. 1.
FIG. 6 is a sectional view taken along the line 6—6 of FIG. 5.
FIG. 7 is a vertical sectional view corresponding to the stage of development shown at step (F) of FIG. 1.
FIG. 8 is a plan view corresponding to the stage of development shown at step (I) of FIG. 1.
FIG. 9 is a sectional view taken along the lines 9—9 of FIG. 8.
FIG. 10 is a vertical sectional view corresponding to the stage of development shown at step (J) of FIG. 1.
FIG. 11 is a vertical sectional view corresponding to the stage of development shown at step (M) of FIG. 1.
FIG. 12 is an enlarged partial perspective view of a completed printed circuit board made by my method and with portions broken away for clarity.

The method of my invention is best described by first referring to FIG. 2, which shows a typical printed circuit board in plan view, and FIG. 3, which shows a cross-section taken along the line 3—3 of FIG. 2. The completed printed circuit board includes a rigid fiberglass substrate 20 of predetermined length and width and of a thickness dependent upon the design requirements of the circuit. Typical thickness of the fiberglass substrate would be 1/32 of an inch. Circuit lines 21 are shown adhered to the fiberglass substrate 20 by an adhesive 22. Connector pads 23 are shown joining the circuit lines 21 at predetermined locations. A minute amount of resist 24 is also indicated, the resist remaining after the chemical stripping process has been performed because of its location between lines 21 and the upper portion of the pad 23. A fiber glass insulation layer 25 is indicated which forms a separation between the layers, the surface line 26 beginning the surface upon which the next circuit layer is formed. The surface 26 is activated and copper or another suitable conductor is plated thereto from which the circuit lines 27 and connector pads 28 are formed. The circuit lines 27 and pads 28 are, of course, a separate circuit. A second layer of fiberglass 29 is shown completing the second layer and providing a surface 30 for a third layer if desired. Resist 31 is shown in the second layer as in the first layer. Hole 32 connects the connector pad 23 of the first circuit with the connector pad 28 of the second circuit. The hole 32 is shown in the plan view of FIG. 2 through connector pad 28.

With reference to FIG. 1, the steps necessary to provide a multi-layer printed circuit board such as the one shown and described in FIGS. 2 and 3 will now be described. The alphabetical notations alongside the steps indicated in FIG. 1 are keyed to FIGS. 4–11 as an aid in visualizing the various stages of the development of the printed circuit board.

Referring to FIG. 4, a suitable fiberglass substrate 20, having a thickness of approximately 1/32 of an inch and of a predetermined length and width is selected as the substrate. The fiberglass, in this instance, is rigid although any of several substrates may be used, for example, a flexible Mylar film. A sheet of copper 33 is laminated to the fiberglass substrate 20 utilizing an adhesive 22. The adhesive may be any of several commercially available adhesives. Copper 33, or any of several other conductors, may also be plated to the substrate 20 by using an electrolytic or electrolysis plating process, having first activated the fiberglass substrate. The fiberglass-copper laminate is typically purchased in this form from any of several well known sources. The copper is approximately 2 mils thick, but may, of course, vary in thickness dependent upon the design requirements of the circuit.

The laminate of fiberglass and copper is next prepared by coating the copper surface with a photo resist. This corresponds with step (B) of FIG. 1. The photo resist may be any of several well known light sensitive enamels; for instance, Kodak Photo Resist, or as it is commonly called, K.P.R. This photo resist is coated to the copper sheet 33 generally by dipping the laminate in the solution. The K.P.R when exposed to light, is insolubilized. With this in mind a negative of the circuit lines may be placed over the copper surface which has been coated with the K.P.R. The surface is exposed to light, but only circuit line areas are exposed, with the balance of the copper, or the treated surface, left unexposed since a negative is used to cover the treated copper surface. Since the exposed areas are insolubilized, the remainder of the unexposed material can be removed by developing as is common in the photolithographic arts. This stage of development corresponds to step (C) of FIG. 1.

Step (D) of FIG. 1 corresponds to FIGS. 5 and 6 which views are taken after portions of the K.P.R. have been developed and washed away. This leaves the copper surface 33 with areas covered with resist 24 defining the circuit lines. It should be carefully noted at this point that only the circuit lines have been printed and not the connector pads. Further, the circuit lines have a flared end as indicated on the drawing at 34. This flared end aids in properly connecting the connector pads to the circuit lines, which steps are discussed in the following description. At this point the circuit may be dyed to show up any flaws in the printing. If flaws appear a touch up procedure may be conducted thereby eliminating pin holes or breaks in the circuit. To properly set or cure the resist 24, the circuit board is placed in an oven for approximately 20 minutes at approximately 250° F.

Having completed the steps necessary to define the circuit lines, it now becomes necessary to define the circuit connector pad to arrive at an operable circuit layer within the multi-layer board. The upper exposed copper and resist surface, which surface is shown in the plan view of FIG. 5, indicated by numeral 35, must be plated with an additional layer of copper from which the pads 23 will be formed. Surface 35 is cleaned and activated prior to the plating of copper thereon. The cleaning of the surface 35 may be done with any procedure which chemically cleans the copper and does not harm the substrate. Among these cleaning methods are vapor blasting, solvent degreasing and a cupric chloride bath. After cleaning, surface 35 is activated prior to subsequent deposition of copper (step E, FIG. 1). "Catalyst 6F," available from the Shipley Company Inc., Wellesley, Mass., activates the entire surface without injury to the substrate. The activation process prepares the surface for a copper deposition step. The activated surface is rinsed and placed in a bath of "Accelerator 19," available from the Shipley Company Inc., which accelerator speeds the initial coverage of copper deposition. The surface 35 is then rinsed again and placed in a bath containing "Copper Mix," available from Shipley Company Inc. This bath results in a deposit of copper on the catalyzed surface. The surface is then cleaned and rinsed and may now be plated in any well known manner. Conventional copper electro-plating practices are typically used, but are started with low amperage per square foot. The above described process is well known in the art and is commonly called the Shipley Seeding Process. Detailed literature on the Shipley Process is readily available from the Shipley Company Inc. Other processes may be used to plate the copper from which the pads are formed. For example, if a tin-lead combination is used as the resist, the above described process is greatly modified.

The process described above results in a copper layer indicated by numeral **35*a*** in FIG. 7. The thickness of this layer is determined by design requirements and is typically of the same order of thickness as the insulation between the layers. FIG. 7 corresponds with step (F) of FIG. 1.

It should be noted, at this point, that the layers of copper 33 and **35*a* cannot be distinguished. However, the resist 24 is clearly defined and sandwiched and surrounded by the copper material forming layers 33 and 35*a***.

Again referring to FIG. 7 the upper surface of copper layer **35*a*** is coated with a light sensitive material such as Kodak Photo Resist in the manner described above. This corresponds with step (G) of FIG. 1. Step (H) of FIG. 1 indicates the printing of the connector pads on the upper surface of the copper 35a, which printing is done in the same manner as printing of circuit lines. Dyeing and touch-up of pads is the same as for lines, described above.

Referring to FIGS. 8 and 9, the connector pad resist pattern is indicated at 36 (step I, FIG. 1). It should be noted that the relation between the connector pads and the circuit lines are slightly over-lapped thereby providing proper contact and reliability of contact between the circuit line and the connector pad.

The entire circuit board is now submered in any desired etching bath, for a predetermined period of time, see step (J). Any desired etching bath may be used or an electrolytic etching procedure may be utilized for eroding away those exposed portions of the surface of the copper layers 33 and 35a which are not protected by the resist layers for the circuit lines and the connector pads. The resist layers are denoted by numerals 24 and 36.

The etching bath is typically an iron-chloride and copper sulphite solution of acids, chlorides or the like suitable for removing copper. Etching is widely used in the photolithographic art and it is not further discussed at this point. An etchant must be used which is not deleterious to the underlying fiber glass substrate 20. The etching process may be done in steps and for predetermined periods of time per each step, dependent upon the results desired. After the etching step is completed, FIG. 10 indicates a cross-section of the circuit board which is the result of the etching process, and is indicated at step (J) of FIG. 1. All the copper has been removed except the copper which forms the circuit lines 21 and the connector pads 23 which is under the resist 24 and 36. It should be noted that the connector pads are integral with the circuit lines forming an integral single layer integrated circuit. The resist may be chemically milled with a suitable solvent thus leaving exposed surfaces at the connector pad and circuit line area (step K).

The surface is next scrubbed and cleaned as preparation for placing the insulation layer thereon (step L). The insulating layer consists of a fiber glass material in liquid form which is coated on the surface as indicated in FIG. 11 at 25.

Referring to FIG. 11, which corresponds to the stage of development of my printed circuit board indicated at step (M) of FIG. 1, the fiber glass insulating layer 25 is pressed onto the circuit board utilizing a laminating press of any of several types which are commercially available. The pressing takes place under suitable temperatures for a predetermined time and results in completely surrounding the circuit with insulation. This completely encloses and insulates the desired circuit. The upper surface 26 of the fiber glass insulation layer 25 is now polished or sanded to expose the upper surface of the connector pads 23 (step M).

The surface 26 is now activated utilizing the above described Shipley Process (step N). This step is carried out to provide an activated surface for subsequent plating of copper to the surface 26 (step O). The copper surface is then printed with the negative of the circuit lines of the second layer of the circuit and steps B–M are carried out to provide a second layer, as well as any other subsequent number of layers.

After all of the layers have been made, holes 32 are drilled through the pads to join the various circuits. These holes are indicated at 32 in FIG. 11.

Refering to FIG. 12, a perspective break-away view is shown in order to clearly show the means of connecting a specific circuit line to a specific connector pad. During the plating process which takes place at step (F) of FIG. 1, the layer of copper 33 which includes the circuit line becomes integral with the layer of copper 35a which includes the connector pad. This results, after the etching step (J) has been carried out, in an area of contact between the circuit line 21 and the connector pad 23 equivalent to the area of the connector pad since the circuit line is co-extensive with the area which has not been etched out during the etching step and which lies under the circuit pad.

After the predetermined number of layers have been made, the entire circuit board may be checked for quality and reliability. Finally, connection into the layer is made through holes 32 in any of several well-known ways.

What is claimed is:

1. The process of making a printed circuit board having at least one printed circuit, including circuit lines and connector pads, said process comprising the steps of:

applying a first protective etch resistant coating to a first conductive layer having a first insulator layer laminated to the opposite side thereof, the protective coating defining the circuit line pattern on said first conductive layer, plating a second conductive and etchable layer on said first conductive layer and said first etch resistant coating, thereby sandwiching and fully enclosing the protective coating therebetween, applying a second protective etch resistant coating to portions of said second conductive layer in such relation to said first etch resistant coating as to define a connector pad pattern in the portions of said second conductive layer lying thereunder in registry with said first conductive layer, and simultaneously etching said first and second conductive layers in a suitable etchant which will not attack said first insulator layer, thereby removing the unprotected conductive layers and defining the circuit line pattern and the connector pad pattern of connector pads in contact therewith.

2. The process of claim wherein:

said first and second etch resistant coatings are provided by applying a light sensitive coating to the first conductive layer, and exposing the light sensitive coating, through a negative print of the circuit lines, to a suitable light source thereby insolubilizing the light sensitive coating in the circuit line areas as defined by the negative print, developing the light sensitive coating in a suitable developing solution whereby the light sensitive coating not exposed is solubilized, washing the solubilized light sensitive coating from the first conductive layer thereby leaving an insolubilized protective coating on the first conductive layer defining the circuit lines of the printed circuit, applying a light sensitive etch resistant coating to the second conductive layer, exposing the connector pad pattern through a negative print of the connector pads to a suitable light source thereby insolubilizing the light sensitive coating in the connector pad area as defined by the negative print, developing the light sensitive coating in a suitable developing solution whereby the light sensitive coating not exposed is solubilized, and washing the solubilized light sensitive coating from the second conductive layer thereby leaving an insolubilized protective coating on the second conductive layer defining the connector pads of the printed circuit.

3. The process of claim 1 including the steps of:

removing the protective coating defining the circuit lines and the connector pads, and applying a second insulator layer to the circuit line and connector pad pattern whereby the circuit lines are sandwiched between the first and second insulator layers and the connector pads are exposed above at least one insulation layer.

4. The process of claim 1 wherein:

the first conductive layer comprises copper and the second conductive layer comprises copper.

5. The process of claim 3 including the steps of:
cleaning the second insulator layer with a suitable cleaning agent,
activating the second insulator layer to provide an affinity for accepting deposition of a conductive material on the second insulator layer,
placing the activated second insulator layer in a deposition bath containing a suitable conductive material whereby the conductive material is deposited upon the activated second insulator layer, and
plating a third conductive layer on the prepared second insulator layer thereby providing a conductive layer from which the circuit lines of a second circuit may be processed in accordance with the steps of claim 1.

6. A printed circuit board having at least one circuit layer and including circuit lines and connector pads made in accordance with the steps of claim 1.

7. A printed circuit board having at least one layer and including circuit lines and connector pads sandwiched between insulator layers made in accordance with the steps of claim 5.

References Cited

UNITED STATES PATENTS

| | | | |
|---|---|---|---|
| 3,090,706 | 5/1963 | Cado | 117—217 X |
| 3,192,136 | 6/1965 | Reed | 96—35 |
| 3,325,379 | 6/1967 | Bussolini | 204—15 X |

ALFRED L. LEAVITT, *Primary Examiner.*

A. GRIMALDI, *Assistant Examiner.*

U.S. Cl. X.R.

96—36.2; 117—217; 156—11; 174—68.5